US006657423B2

United States Patent
Tanizawa (10) Patent No.: US 6,657,423 B2
(45) Date of Patent: Dec. 2, 2003

(54) PHYSICAL QUANTITY DETECTION DEVICE WITH ERROR DETECTION IN POWER SUPPLY LINE THERETO

(75) Inventor: Yukihiko Tanizawa, Kariya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/001,983

(22) Filed: Dec. 5, 2001

(65) Prior Publication Data
US 2002/0097034 A1 Jul. 25, 2002

(30) Foreign Application Priority Data
Dec. 6, 2000 (JP) ........................................ 2000-371929

(51) Int. Cl.⁷ .................... G01R 31/02; G01R 31/08; G01R 31/12; G01N 27/00
(52) U.S. Cl. .................. 324/72; 324/71.1; 324/522; 324/537; 324/678; 324/548; 340/660
(58) Field of Search ........................ 324/72, 71.1, 522, 324/537, 678, 548; 702/66; 327/561, 20, 307; 73/1.57, 129, 766, 754, 708, 721; 701/34, 31, 65; 340/660, 661, 662, 663

(56) References Cited

U.S. PATENT DOCUMENTS

| | | | | |
|---|---|---|---|---|
| 4,986,131 A | * | 1/1991 | Sugiyama et al. | 73/766 |
| 5,042,307 A | * | 8/1991 | Kato | 73/708 |
| 5,914,635 A | * | 6/1999 | Yamamoto | 327/561 |
| 5,965,807 A | * | 10/1999 | Yamashita et al. | 73/129 |
| 6,055,972 A | * | 5/2000 | Fujimoto et al. | 123/688 |
| 6,188,340 B1 | * | 2/2001 | Matsumoto et al. | 341/110 |
| 6,316,990 B1 | * | 11/2001 | Tanizawa | 327/538 |
| 6,343,498 B1 | * | 2/2002 | Oba et al. | 73/1.57 |
| 6,401,018 B1 | * | 6/2002 | Oba et al. | 701/34 |
| 6,422,088 B1 | * | 7/2002 | Oba et al. | 73/754 |

FOREIGN PATENT DOCUMENTS

| JP | A-3-210047 | 9/1991 |
|---|---|---|
| JP | A-7-27673 | 1/1995 |

* cited by examiner

Primary Examiner—Andrew H. Hirshfeld
Assistant Examiner—Wasseem H. Hamdan
(74) Attorney, Agent, or Firm—Posz & Bethards, PLC (57) ABSTRACT

A pressure sensor is supplied with a supply voltage from a system control circuit having the function for changing the supply voltage. When the supply voltage is within a predetermined voltage range, the pressure sensor outputs the detection signal corresponding to the pressure to be measured and outputs a predetermined voltage which is irrespective of the pressure. More specifically, the system control circuit outputs the supply voltage at a value outside a predetermined voltage range in a diagnostic mode, that is, a value which is higher than the measuring mode, in order to turn on the transistors Q1 and Q2 to supply the predetermined voltage to the system control circuit to detect an error caused by increase in contact resistance between the pressure sensor and the system control circuit.

14 Claims, 10 Drawing Sheets

PHYSICAL QUANTITY DETECTION DEVICE WITH ERROR DETECTION IN POWER SUPPLY LINE THERETO

BACKGROUND OF THE INVENTION

1. Field of the Invention

This invention relates to a physical quantity detection device for generating a physical quantity detection signal.

2. Description of the Prior Art

Figure 9:
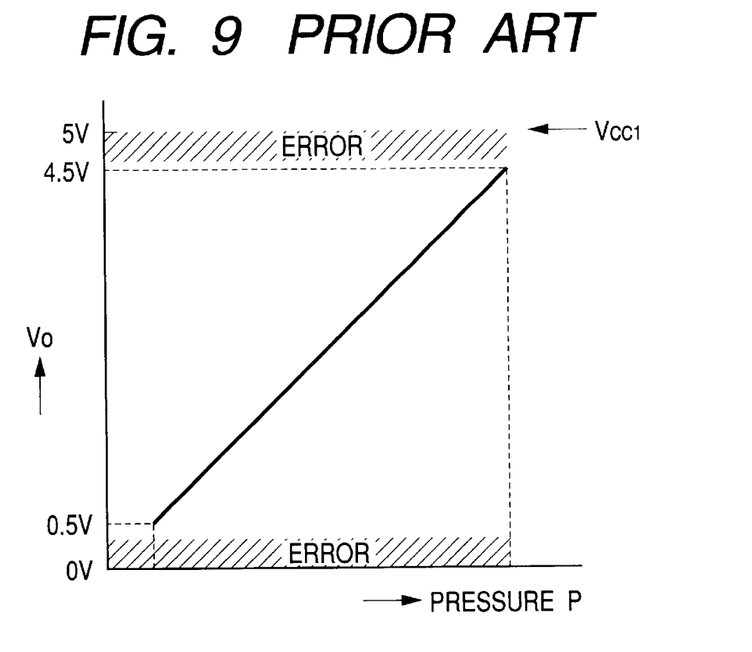
FIG. 9 is a graphical drawing of voltage ranges for error detection in the prior art pressure sensor.

Generally, pressure sensors for vehicles operate with a single power supply of 5 V, and the output range is from 0.5 to 4.5 V. Outside this range within 0 to 5 V, there are error detection ranges from 0 to 0.3 V and from 4.7 to 5V as shown in FIG. 9. FIG. 9 is a graphical diagram illustrating an output range and error detection ranges in a prior art pressure sensor. If the pressure sensor generates its output at the error detection range, a diagnostic function provided to a control system for the pressure sensor or the like detects the error only by comparing the detected voltage with reference voltages, i.e., 0.3 V and 4.7 V.

Figure 6:
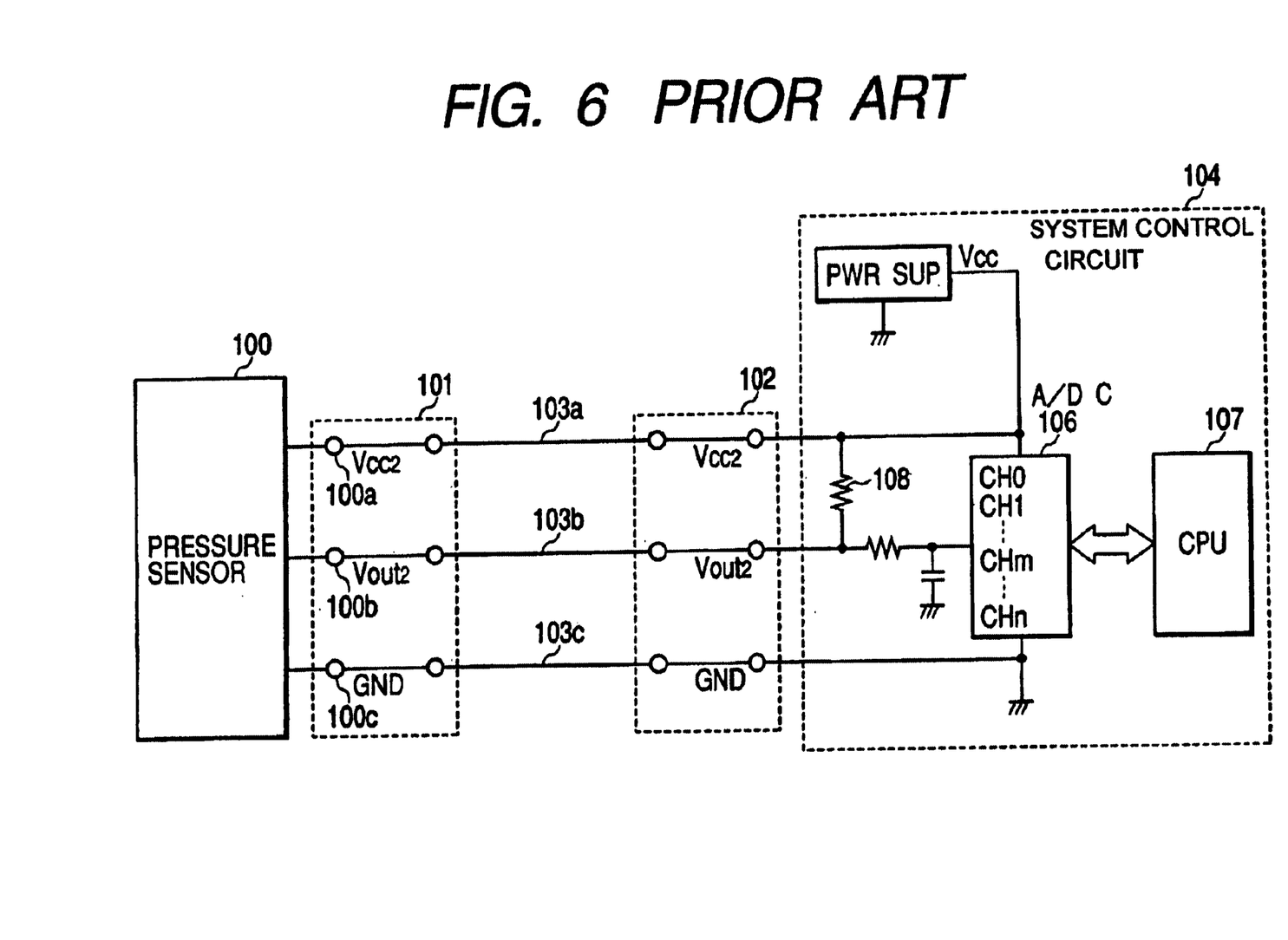
FIGS. 6 and 7 show interconnections when the pressure sensor is used in a vehicle in the prior art pressure sensors.
Figure 7:
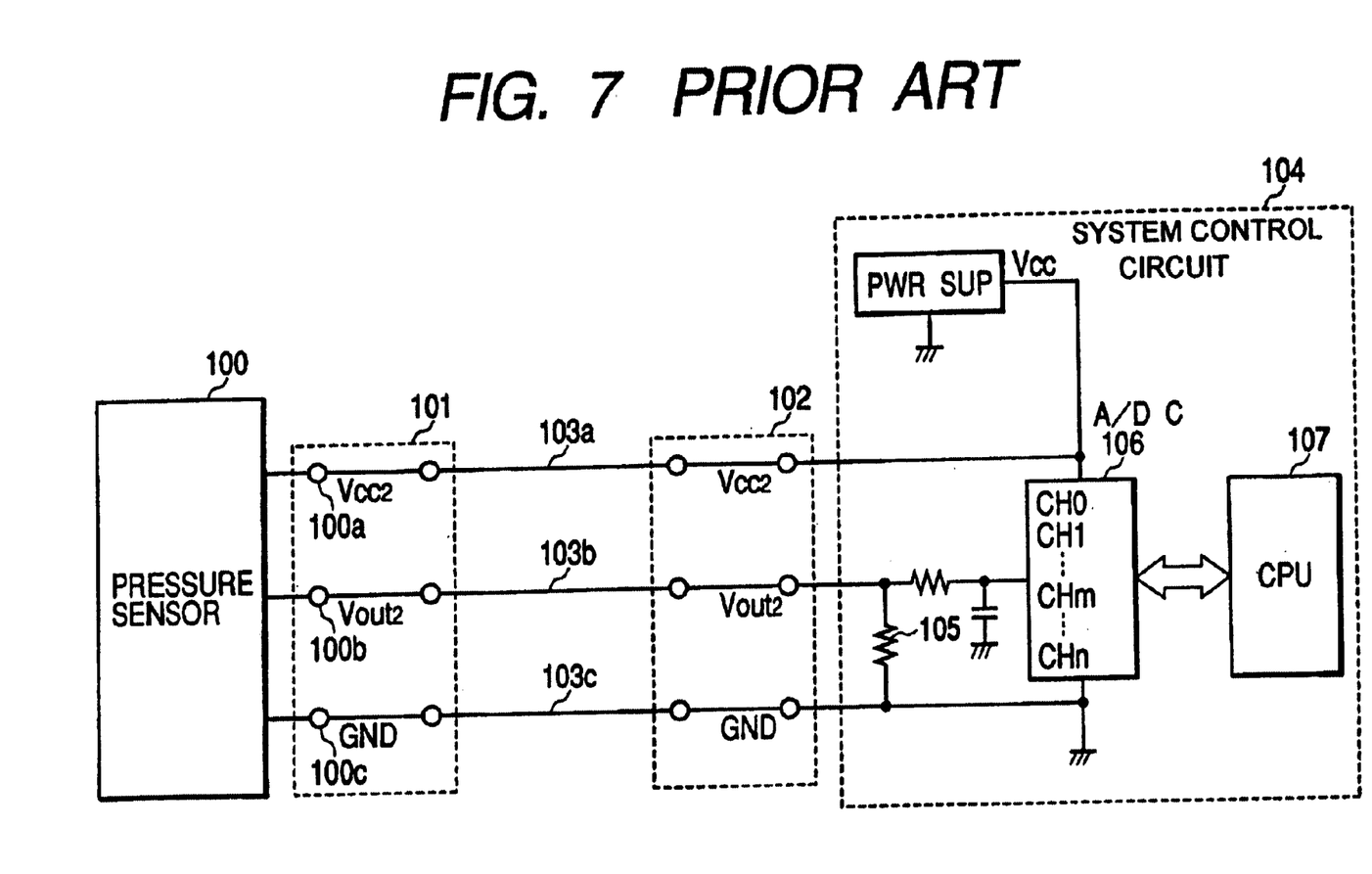

FIGS. 6 and 7 show interconnections when the pressure sensor is used in a vehicle in the prior art pressure sensors. The difference between FIGS. 6 and 7 is that in FIG. 6, a pull-up resistor 108 is provided, on the other hand, in FIG. 7, a pull-down resistor 105 is provided. Connector assembly 101, which includes connectors 100a, 100b, and 100c, and connector assembly 102 provide interconnections between pressure sensor 100 and system control circuit 104. These interconnections between the pressure sensors 100 and the system control circuits 104 provide disconnection detection.

For example, in FIG. 7, the pressure sensor 100 is connected to the system control circuit 104 with a wire cable 103a for power supply, a wire cable 103b for outputting the detection signal, and a wire cable 103c for grounding, wherein the line connected to the output signal wire cable in the system control circuit 104 is connected to the ground through a pull-down resistor 105. Then, if the wire cable 103a or its connector 100a or the wire cable 103b or its connector 100b is disconnected, the detected voltage at the wire cable 103b becomes zero volts. If the ground line 103c or its connector 100c is disconnected, the detected voltage on the wire cable 103b becomes higher than 4.7 V due to voltage dividing with the internal resistance of the pressure sensor 100 and the pull-down resistor 105. A CPU 107 detects this voltage as an error signal through an A/D converter 106. Then, the CPU 107 judges that there is disconnection between the pressure sensor 100 and the system control circuit 104.

In the circuit structure shown in FIG. 6, the disconnection condition is detected in the similar manner.

Figure 8:
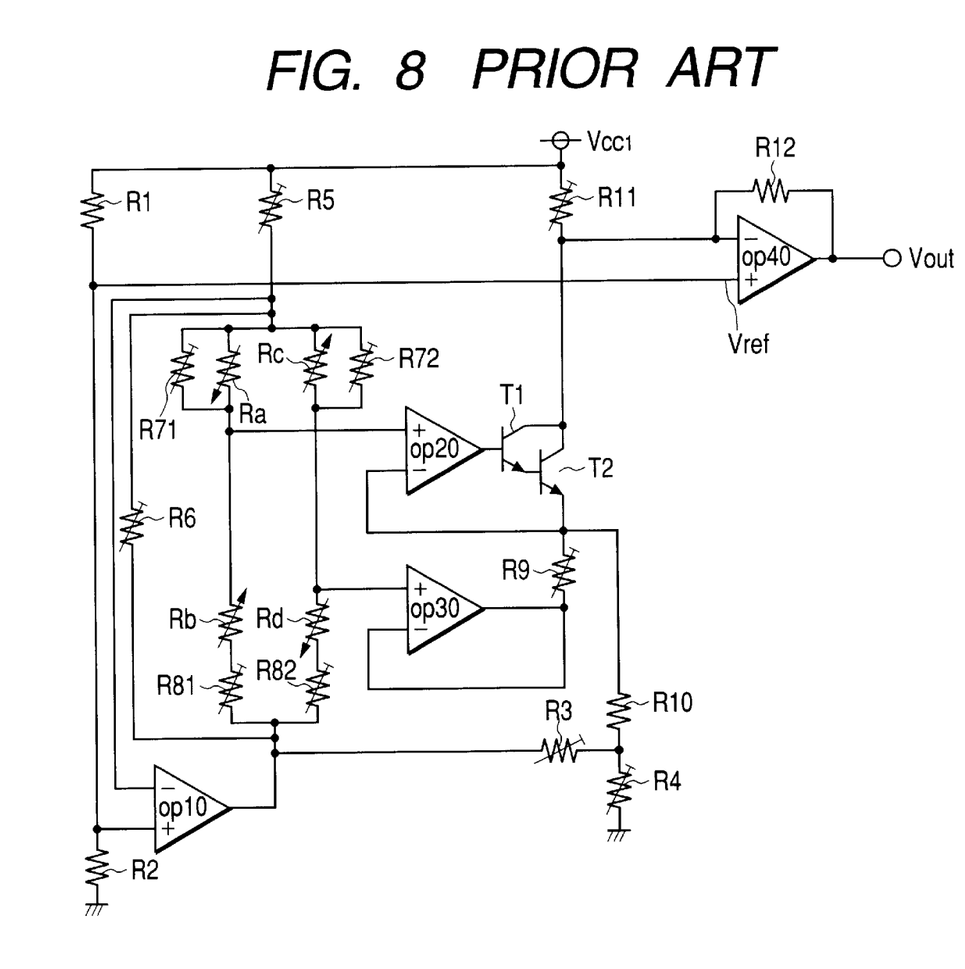
FIG. 8 is a schematic circuit diagram of a prior art pressure sensor.

FIG. 8 is a schematic circuit diagram of a prior art pressure sensor. This prior art pressure sensor includes resistors Ra, Rb, Rc, and Rd as strain gages which are formed in a diaphragm arranged at a middle of an Si chip. When a pressure on the diaphragm increases, the resistances of the resistors Ra and Rd decreases. On the other hand, resistances of the resistors Rb and Rc increase. Thus, these resistors Ra, Rb, Rc, and Rd form a Wheatstone bridge.

Resistors R1, R2, R3, R4, R5, R6, R71, R72, R81, R82, R9, R10, R11, and R12 other than the resistors Ra, Rb, Rc, and Rd comprise thin film resistors such as CrSi films of which temperature coefficients of resistance TCRs are almost zero.

The resistors R1 and R2 divide the supply voltage Vcc to generate a middle voltage at the junction point between these resistors which is used as a reference voltage for operational amplifiers OP10 and OP40.

The operational amplifier OP10 and the resistors R1, R2, and R5 form a constant current source for driving the Wheatstone bridge. This constant current source keeps the constant current supply irrespective of temperature variation because the temperature coefficient of resistance of the resistor R5 is almost zero.

The strain gages operate such that if they are driven with a constant current, the sensitivity in pressure is temperature-compensated. That is because the strain gages are formed of p type diffused resistors including impurity at a concentration of about $10^{20}$ cm$^{-3}$. This fact is well known. Moreover, the resistors R71, R72, R81, and R82 are used for zero point adjustment of the Wheatstone bridge by trimming the resistors R71, R72, R81, and R82 with laser. The resistor R6 is connected in parallel with the Wheatstone bridge for fine adjustment of temperature characteristic in sensitivity.

The operational amplifiers OP20 and OP30 are provided as voltage follower circuits supplied with the voltages at the junction points of the Wheatstone brides. More specifically, an output of the operational amplifier OP20 is connected to a transistor T1 which is connected to a transistor T2 with Darlington connection. The operational amplifier OP40 operates as an amplifier and an adder. The gain of the operational amplifier for the pressure signal is R12/R9. The inverting input of the operational amplifier OP40 is connected to the supply power $V_{CC1}$ through the resistor R11, so that zero point of the sensor output $V_{O1}$ is adjusted by trimming the resistor R11. The resistors R10, R3, and R4 are used for temperature compensation of the zero point by trimming the resistor R3 or the resistor R4. Here, the resistor R10 has a larger resistance than the resistors R3 and R4.

This circuit operates with reference to the above-mentioned reference voltage generated by dividing the supply voltage $V_{CC1}$. Thus, if the supply voltage $V_{CC1}$ varies within an allowable range, the output voltage $V_{O1}$ varies in proportion to the variation of the supply voltage $V_{CC1}$. More specifically, the supply voltage $V_{CC1}$ is commonly used between the A/D converter 106 in the system control circuit 104 and the reference voltage generation portion in the pressure sensor. This suppresses the error in the pressure detection signal ($V_{O1}$) with respect to variation in supply voltages.

Figure 10:
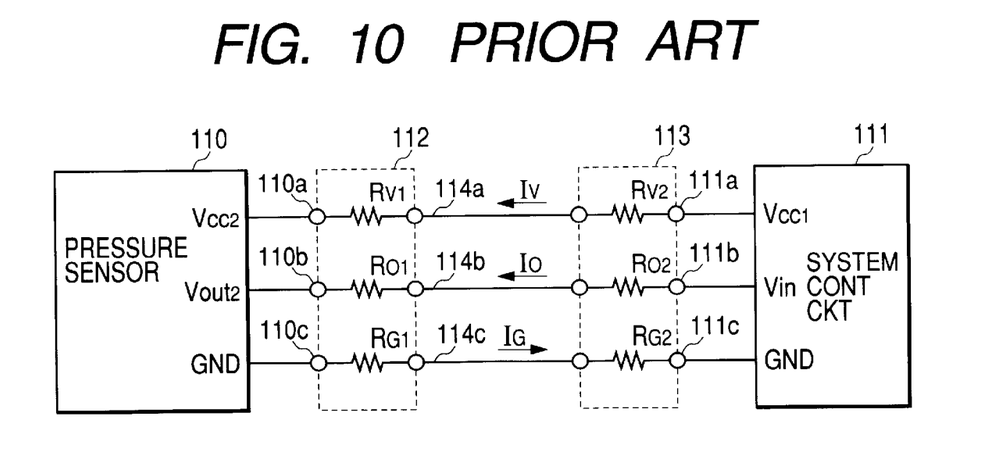
FIG. 10 is an interconnection diagram of the prior art pressure sensor.

FIG. 9 is a graphical drawing of voltage ranges for error detection in the prior art pressure sensor. FIG. 10 is an interconnection diagram of the prior art pressure sensor for a vehicle. The pressure sensor 110 is connected to the system control circuit 111 through the cables and connectors because the pressure sensor 110 is located remote from the system control circuit 111. In this interconnection, if a contact resistance in a connector increases, the output voltage may become an intermediate voltage outside the error detection range shown in FIG. 9.

This condition could not be detected with the pull-down resistor or the pull-up resistor.

SUMMARY OF THE INVENTION

The aim of the present invention is to provide a superior physical quantity detection device.

According to the present invention, a first aspect of the present invention provides a physical quantity detection device supplied with a supply voltage from a system control circuit having a function for varying said supply voltage, comprising: a sensor circuit for generating a detection signal corresponding to a physical quantity to be measured; and an output circuit for outputting said detection signal when said supply voltage is within a predetermined voltage range and for generating and outputting a predetermined voltage which is irrespective of said physical quantity when said supply voltage is outside said predetermined voltage range.

According to the present invention, a second aspect of the present invention provides a physical quantity detection device on the basis of the first aspect, wherein said sensor circuit comprises: a bridge circuit for generating said detection signal corresponding to said physical quantity; and wherein said outputting circuit comprising: a voltage follower circuit coupled to said bridge circuit; and control means for controlling an output of said voltage follower circuit such that said voltage follower circuit outputs said detection signal when said supply voltage is within said predetermined voltage range, and said voltage follower circuit generates said predetermined voltage which is irrespective of said detection signal when said supply voltage is outside said predetermined voltage range.

According to the present invention, a third aspect of the present invention provides a physical quantity detection device on the basis of the second aspect, wherein said control means comprises a first transistor turning on and off on the basis of said supply voltage, wherein said first transistor turns off when said supply voltage is within said predetermined voltage range and turns on to make the output of said voltage follower circuit go a low voltage level when said supply voltage is outside said predetermined voltage range.

According to the present invention, a fourth aspect of the present invention provides a physical quantity detection device on the basis of the second aspect, further comprising: an adder including an operational amplifier of which inverting input is supplied with said detection signal and of which non-inverting input is supplied with a reference voltage generated by voltage-dividing said supply voltage and a first resistor connected between said inverting input and an output of said operational amplifier; and current changing means for changing a current flowing through said first resistor when said supply voltage is outside said predetermined voltage range to make said operational amplifier output a predetermined voltage signal.

According to the present invention, a fifth aspect of the present invention provides a physical quantity detection device on the basis of the fourth aspect, wherein said current changing means comprises a transistor and a second resistor connected between said inverting input of said operational amplifier and said transistor, wherein said transistor turns on when said supply voltage is outside said predetermined voltage range to flow a predetermined current through said second resistor.

According to the present invention, a sixth aspect of the present invention provides a physical quantity detection device on the basis of the first aspect, further comprising first to third cables for connecting said sensor circuit to said system control circuit, said first cable supplying said supply voltage from said system control circuit to said sensor circuit, said second cable supplying said detection signal to said system control circuit, and said third cable connecting a ground of said physical quantity detection device to a ground of said system control circuit.

According to the present invention, a seventh aspect of the present invention provides a physical quantity detection device supplied with a supply voltage from a system control circuit having a function for varying said supply voltage comprising: a sensor circuit for generating a detection signal corresponding to a physical quantity to be measured; and an output circuit for outputting said detection signal when said supply voltage is within a first predetermined voltage range and for generating and outputting a predetermined voltage which is irrespective of said physical quantity when said supply voltage is within a second predetermined voltage range.

According to the present invention, an eighth aspect of the present invention provides a physical quantity detection device, comprising: a sensor circuit for generating a detection signal in accordance with a physical quantity; and an outputting circuit for outputting said detection signal when said supply voltage is within a predetermined voltage range and for generating and outputting a predetermined voltage signal when said supply voltage is outside said predetermined voltage range.

According to the present invention, a ninth aspect of the present invention provides a physical quantity detection device on the basis of the seventh aspect, wherein said sensor circuit is fixedly connected to said outputting circuit.

According to the present invention, a tenth aspect of the present invention provides a physical quantity detection device on the basis of the seventh aspect, further comprising: a system control circuit for generating said supply voltage within said predetermined voltage range in a first mode and outside said predetermined voltage range in a second mode; a first cable including connectors for supplying said supply voltage from said system control circuit to said sensor circuit and said outputting circuit; a second cable including connectors for supplying said detection signal and said predetermined voltage signal to said system control circuit; and a third cable including connectors for connecting a ground of said bridge circuit and said outputting circuit to a ground of said system control circuit.

According to the present invention, an eleventh aspect of the present invention provides a physical quantity detection device on the basis of the ninth aspect, further comprising: a judging circuit for judging whether said voltage signal is within an allowable voltage range and outputting a judging result in said second mode to judge conditions of said connectors of said first to third cables.

According to the present invention, a twelfth aspect of the present invention provides a physical quantity detection device on the basis of the ninth aspect, wherein said system control circuit comprises: a first power supply for generating said supply voltage; a second power supply for generating another supply voltage and for generating a voltage data of said another supply voltage, said first power supply generates said supply voltage within said predetermined voltage range in accordance with said voltage data to equalize said supply voltage to said another supply voltage in said first mode, said physical quantity detection device further comprising: an A/D converter supplied with said another supply voltage for converting said detection signal into a digital detection signal, wherein voltage characteristic of said bridge circuit and a voltage characteristic of said A/D converter is compensated by equalizing said supply voltage to said another supply voltage in said first mode.

BRIEF DESCRIPTION OF THE DRAWINGS

The object and features of the present invention will become more readily apparent from the following detailed description taken in conjunction with the accompanying drawings in which.

The same or corresponding elements or parts are designated with like references throughout the drawings.

DETAILED DESCRIPTION OF THE INVENTION

First Embodiment

Figure 1:
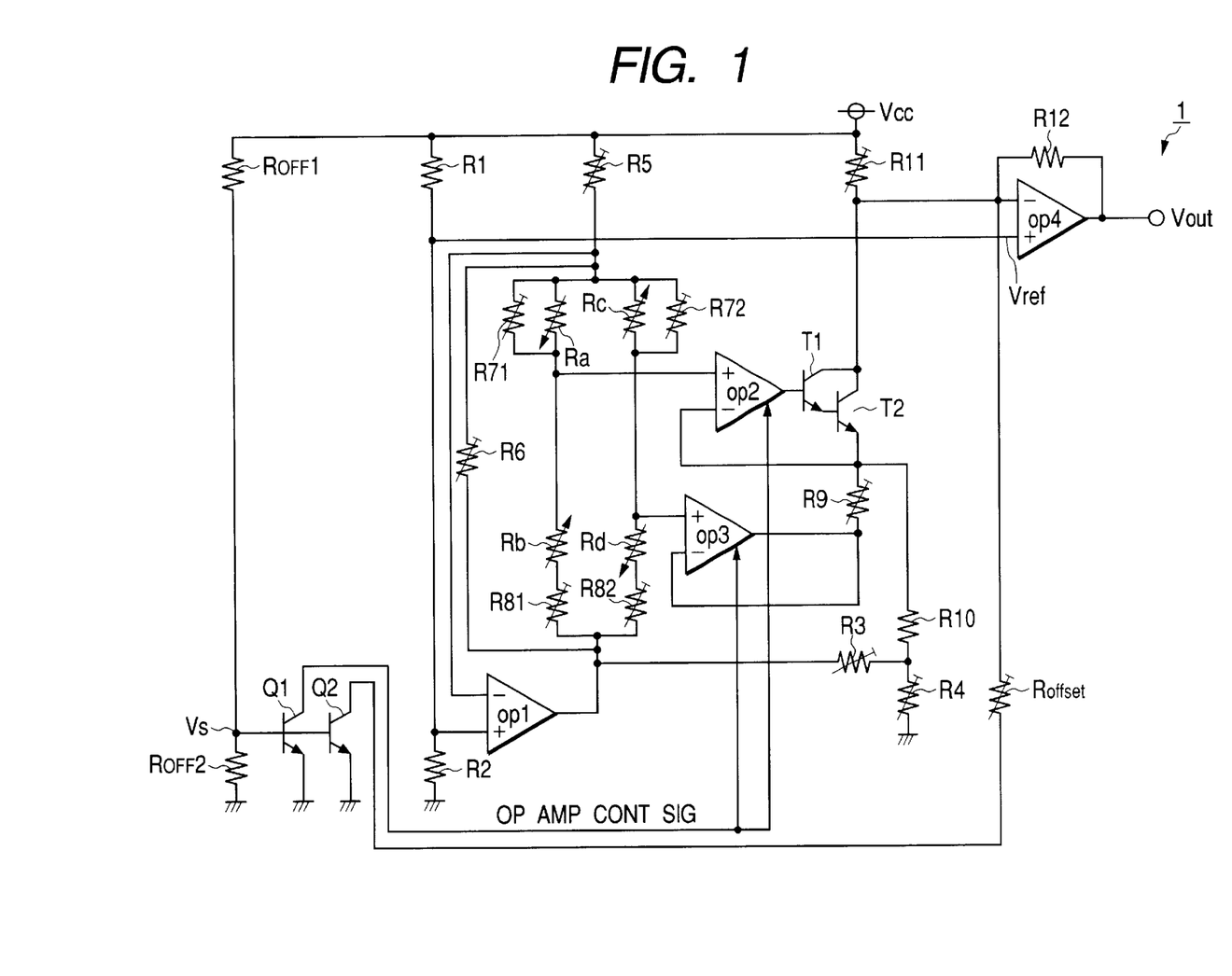
FIG. 1 is a schematic circuit diagram of a pressure sensor according to a first embodiment of the present invention.

FIG. 1 is a schematic circuit diagram of a pressure sensor 1 according to a first embodiment of the present invention.

The pressure sensor 1 includes resistors Ra, Rb, Rc, and Rd as strain gages which are formed in a diaphragm formed at the middle of an Si chip. When a pressure on the diaphragm increases, the resistances of the resistors Ra and Rd decreases. On the other hand, resistances of the resistors Rb and Rc increase. These resistors Ra, Rb, Rc, and Rd form a Wheatstone bridge.

Resistors R1, R2, R3, R4, R5, R6, R71, R72, R81, R82, R9, R10, R11, and R12 other than these resistors Ra, Rb, Rc, and Rd comprise thin film resistors such as CrSi films of which temperature coefficients of resistance TCRs are almost zero.

The resistors R1 and R2 divide the supply voltage Vcc to generate a middle voltage at the junction point between these resistors which is used as a reference voltage Vref for operational amplifiers OP1 and OP4.

The operational amplifier OP1 and the resistors R1, R2, and R5 form a constant current source for driving the Wheatstone bridge. This constant current source maintains the constant current supply irrespectively of temperature variation because the temperature coefficient of resistance of the resistor R5 is almost zero.

The strain gages Ra, Rb, Rc, and Rd operate such that if they are driven with a constant current, the sensitivity in pressure is temperature-compensated. That is, the strain gages Ra, Rb, Rc, and Rd are formed of p type diffused resistors including impurity at a concentration of about $10^{20}$ cm$^{-3}$. Moreover, the resistors R71 ad R72, R81, and R82 are used for zero point adjustment of the Wheatstone bridge by trimming the resistors R71, R72, R81, and R82 with laser. The resistor R6 is connected in parallel with the Wheatstone bridge for fine adjustment of temperature characteristic in sensitivity.

The operational amplifiers OP2 and OP3 are provided as voltage follower circuits supplied with the voltages at the junction points of the Wheatstone brides. More specifically, an output of the operational amplifier OP2 is connected to a transistor T1 which is connected to a transistor T2 with Darlington connection. The operational amplifier OP4 operates as an amplifier and an adder. The gain of the operational amplifier OP4 for the pressure signal is R12/R9. The inverting input of the operational amplifier OP4 is connected to the supply voltage Vcc through the resistor R11, so that zero point of the sensor output Vout is adjusted by trimming the resistor R11. The resistors R10, R3, and R4 are used for temperature compensation of the zero point by trimming the resistor R3 or the resistor R4. Here, the resistor R10 has a larger resistance than the resistors R3 and R4.

Moreover, the pressure sensor 1 further includes resistors $R_{OFF1}$ and $R_{OFF2}$ for voltage-dividing the supply voltage Vcc to output a voltage Vs, a first transistor Q1 turning off and on the basis of the voltage Vs, a second transistor Q2 turning on and off on the basis of the voltage Vs, and a resistor $R_{offset}$ connected between the inverting input of the operational amplifier OP4 and the collector of the transistor Q2. Moreover, internal circuit structures of the operational amplifiers OP2 and OP3 are modified from the general operational amplifier structures to be controlled by the transistor Q1.

Figure 2:
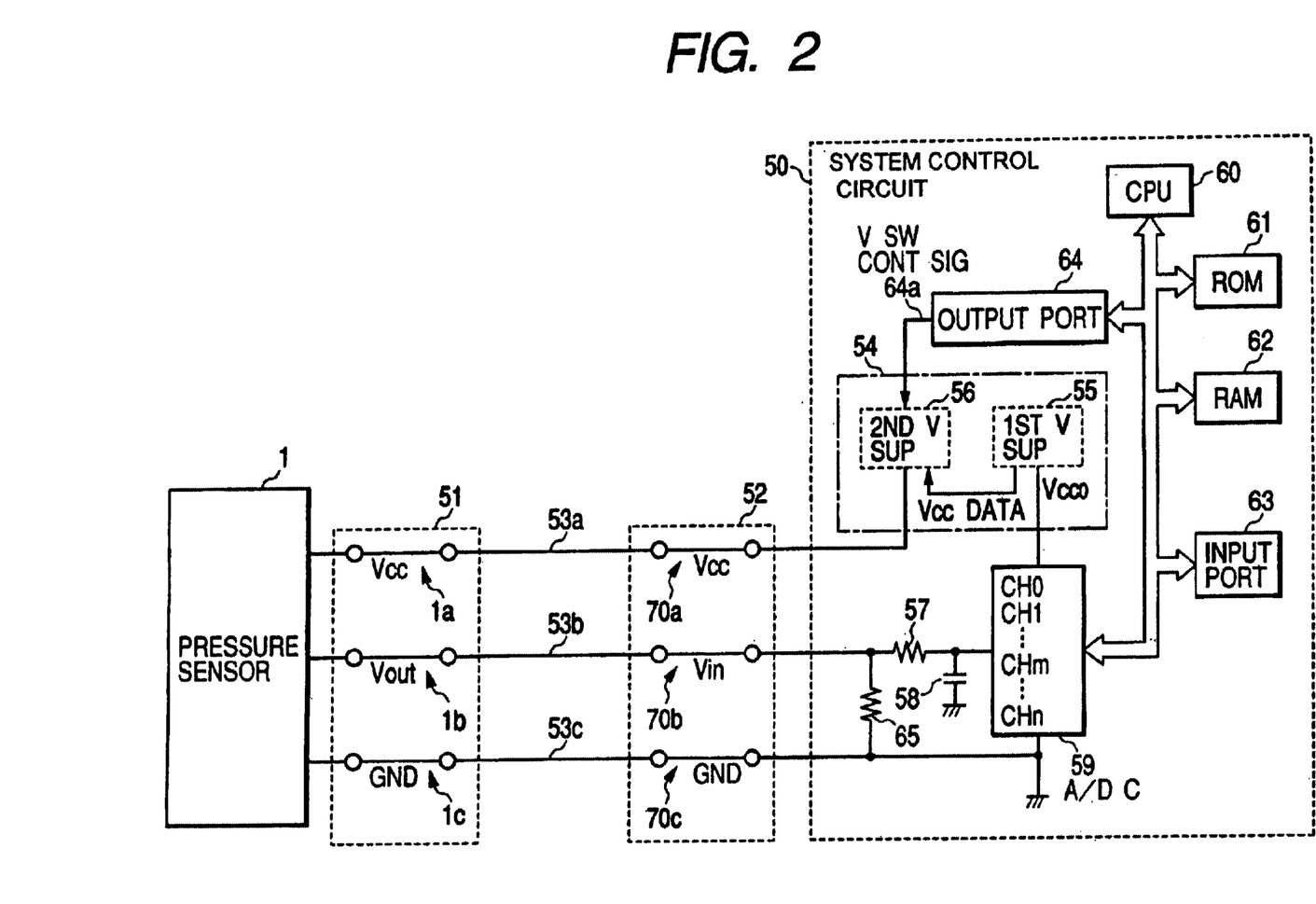
FIG. 2 is a block diagram of a system control circuit and interconnection between the pressure sensor and the system control circuit according to the present invention.

FIG. 2 is a block diagram of a system control circuit 50 and interconnection between the pressure sensor 1 and the system control circuit 50 through connector assembly 51, which includes connectors 1a, 1b, and 1c, and connector assembly 52, which includes connectors 70a, 70b, and 70c. Each connector assembly includes two halves. For example, one half of the connector assembly 51 is connected to pressure sensor 1, and the other half is connected to the cables 53a, 53b, and 53c. The pressure sensor 1 is supplied with the supply voltage Vcc through a cable 53a including connectors 1a and 70a, The sensor output Vout is supplied to the system control circuit 50 through a cable 53b including connectors 1b and 70b. The ground of the pressure sensor 1 is connected to the ground of the system control circuit 50 through a cable 53c including connectors 1c and 70c. In the normal contact condition, contact resistances at connectors 1a to 1c and 70a to 70c are almost zero ohm.

Figure 3:
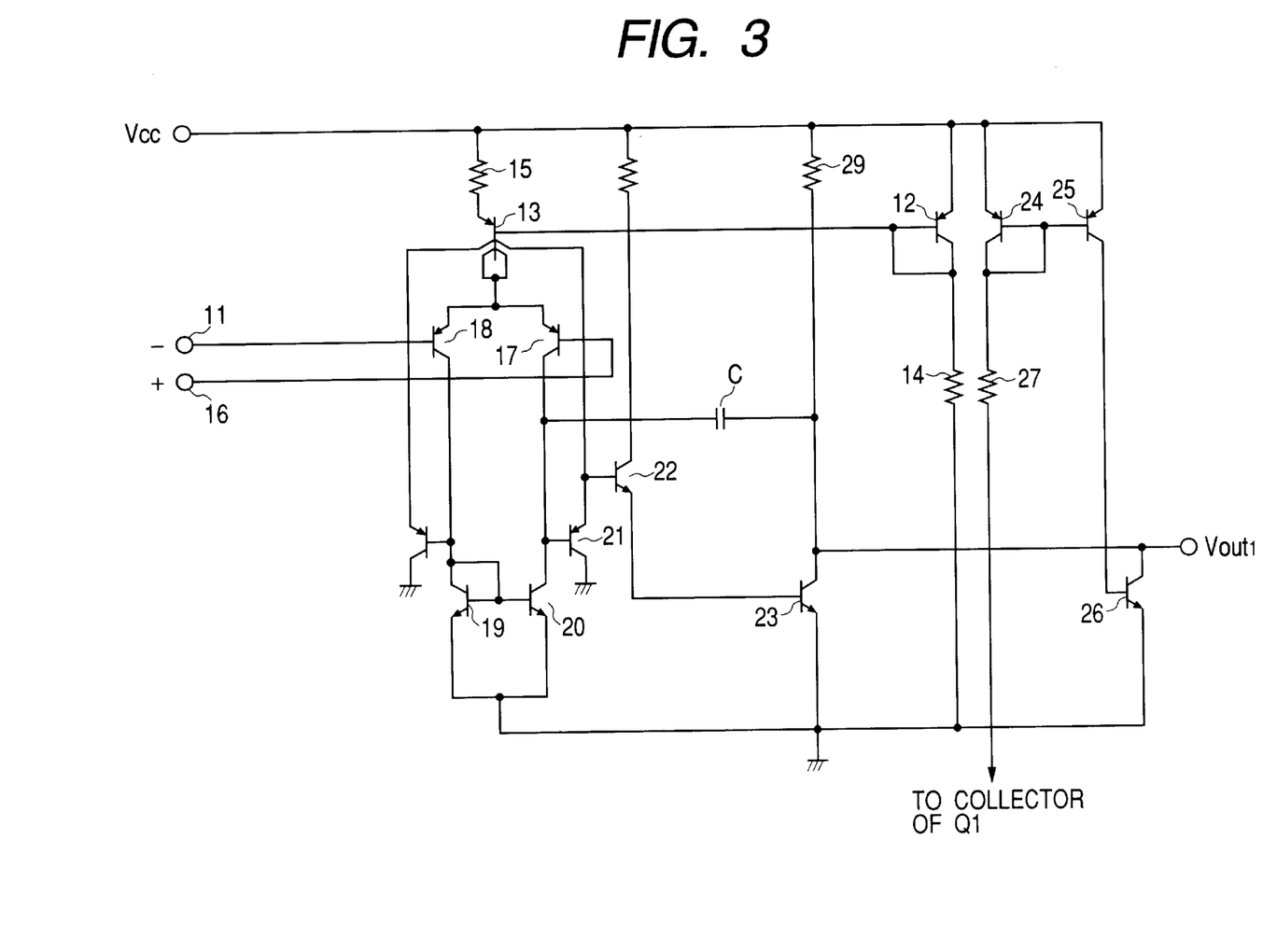
FIG. 3 is a schematic circuit diagram of the operational amplifiers according to the first embodiment.

FIG. 3 is a schematic circuit diagram of the operational amplifiers OP2 and OP3 according to the first embodiment.

The operational amplifier OP2 and OP3 have transistors 24, 25, and 26 and a resistor 27 in addition to the general structure of operational amplifiers. The collector of the transistor 24 is connected to the collector of the transistor Q1 through the resistor 27. These operational amplifiers OP2 and OP3 perform different operations in accordance with the turning on and off conditions of the transistor Q1.

When the voltage Vs is higher than a predetermined voltage, the transistors Q1 and Q2 turn on. That is, if the power supply 56 supplies the supply voltage Vcc which is outside the predetermined voltage, the transistor Q1 turns on.

In the operational amplifiers OP1 and OP2, transistors 12 and 13 form a current mirror circuit. The transistor 12 and the resistor 14 flow a reference current, and in response to this, the transistor 13 flows a current in accordance with the resistance of the resistor 15.

When differential inputs are supplied through the inverting input terminal 11 and the non-inverting input terminal 16 to transistors 18 and 17, collector currents of the transistors 19 and 20 vary slightly on the basis of the voltage difference between the inverting input 11 and the non-inverting input terminal 16. This successively varies the currents flowing through transistors 21, 22, and 23.

Thus, the potential derived by subtracting the voltage drop in the resistor 29 from the supply voltage Vcc is outputted at the output terminal Vout1 of the operational amplifier. This provides a voltage follower operation.

When the transistor Q1 is turn on, i.e., the supply voltage is outside the predetermined voltage range, the transistor 24 turns on, and as well as the transistors 25 and 26 turns on. Then, this makes the level at the output terminal Vout1 low, i.e., transistor's Vce (sat)≈0.2V or lower.

This makes the transistors T1 and T2 having Darlington connection Off. Thus, the pressure signal from the bridge and the signal for temperature compensation of zero point are cut off. Then, the operational amplifier OP4 generates an output corresponding only to the zero point trimming signal from the resistor R11. However, in this circuit, the zero point trimming current is superimposed on the zero point temperature compensation signal actually. Then, the transistor Q2 is turned on to supply a current signal derived by current limited by the resistor Roffset to the inverting input of the operational amplifier OP4. This current is added to the zero point trimming signal at the inverting input of the operational amplifier OP4. Thus, turning on of the transistor Q2 changes the current flowing through the resistor R12.

In other words, the current path of the zero point trimming current is changed from the resistor R10 to the resistor Roffset, so that the current flowing through the resistor R12 is changed to make the operational amplifier output a predetermined voltage signal.

When the supply voltage Vcc is outside the predetermined voltage range, that is, the transistors Q1 and Q2 are turned on, if it is assumed that resistance at connectors 1a to 1c and 70a to 70c are almost zero, i.e., in the normal condition, the output of the operational amplifier Vout1 is given by:

$$Vout = Vref - R12 \cdot \left\{ \frac{(Vcc - Vref)}{R11} - \frac{(Vref - Vce(sat)_{Q1})}{Roffset} \right\} \quad (1)$$

wherein Vref=Vcc·R2/(R1+R2). Vce(sat)$_{Q1}$ is Vce(sat) of the transistor Q1 and is generally about 0.2 V or lower.

If a contact resistance at any of the connectors 1a to 1c and 70a to 70c increases, that is, there is poor contact, the output of the operational amplifier OP4 deviates from the value represented by Eq. (1). The system circuit 50 can detect this by comparing it with a reference.

As mentioned above, when the contact resistance condition is detected, the power supply 56 supplies the supply voltage Vcc of which value is outside the predetermined voltage range in a diagnostic mode, the sensor 1 outputs a predetermined voltage which is compared with the reference to detect an error in interconnection, i.e., poor contact, between the sensor 1 and the system control circuit 1.

In FIG. 2, the pressure sensor 1 is coupled to the system control circuit 50 with a wire harness including the cable wires 53a to 53c through connectors 1a to 1c and 70a to 70c as mentioned above.

The system control circuit 50 includes, a power supply unit 54, a CPU 60, a ROM 61, a RAM 62, an input port 63, and an A/D converter 59.

The power supply unit 54 includes the voltage supply 55 and the voltage supply 56. The voltage supply 55 generates the supply voltage Vcco controlled toward a target voltage (for example, 5V) and supplied to the A/D converter 59 and generates Vcc data indicative of the voltage of the supply voltage Vcco. The voltage supply 56 generates the supply voltage Vcc on the basis of the voltage of the supply voltage Vcco from the power supply 54 to equalize the supply voltage Vcc to the supply voltage Vcco in the measuring mode. Moreover, the voltage supply 56 changes the voltage of the supply voltage Vcc in response to the voltage switching control signal 64a from the CPU 60 through the output port 64. That is, in the measuring mode the power supply 56 generates the supply voltage Vcc within a predetermined voltage range, that is, within a first voltage range and in the diagnostic mode, the power supply 56 generates the supply voltage Vcc which is outside the predetermined voltage range, that is, within a second voltage range which is different from the first voltage range. The CPU 60 changes the mode with the voltage switching control signal 64a.

When the CPU 60 measures the physical quantity, the CPU 60 operates the power supply 56 in the measuring mode. In interconnection diagnostic mode, the CPU 60 operates the power supply 56 to output the supply voltage Vcc which is outside the predetermined voltage range. More specifically, the power supply 56 generates the supply voltage Vcc in the diagnostic mode which is higher than that in the measuring mode. This is provided by changing a gain of an operational amplifier (not shown) in the power supply 56 in response to the voltage switching control signal 64a. This turns on the transistors Q1 and Q2.

The system control circuit 50 further includes a filter including a resistor 57 and a capacitor 58. The sensor output Vout is supplied to the A/D converter 59 through this filter.

Moreover, the CPU 60 receives signals from various switches and sensor signals through the input port 63 and outputs controls signals to various actuators in accordance with the programs in the ROM 61.

In this system control circuit 50, though the supply voltage Vcc is changed in response to the voltage switching control signal 64a, the supply voltage Vcco of the power supply 55 is not changed to precisely measure the sensor output Vout. On the other hand, the voltage characteristic of the pressure sensor 1 is cancelled by the voltage characteristic of the supply voltage Vcco supplied to the A/D converter 59. That is, the supply voltage Vcc from the voltage supply 56 should be varied with the value of the supply voltage Vcco from the power supply 55. Then, the voltage supply 55 outputs Vcc data indicative of the voltage of the supply voltage Vcco. The voltage supply 56 varies the supply voltage Vcc in accordance with the Vcc data. The voltage supply 56 generates the supply voltage Vcc within the predetermined voltage range in accordance with the Vcc data (voltage data) to equalize the supply voltage Vcc to the supply voltage Vcco in the measuring mode.

The Vcc data is generated in accordance with an output of an operational amplifier (not shown) included in the voltage supply 55 for controlling the supply voltage Vcc.

In the system control circuit 50, an input terminal Vin for inputting the sensor output is connected to the ground with a pull-down resistor 65. Thus, disconnection of wire cables 53a to 53c can be detected in the measuring mode.

Figure 11:
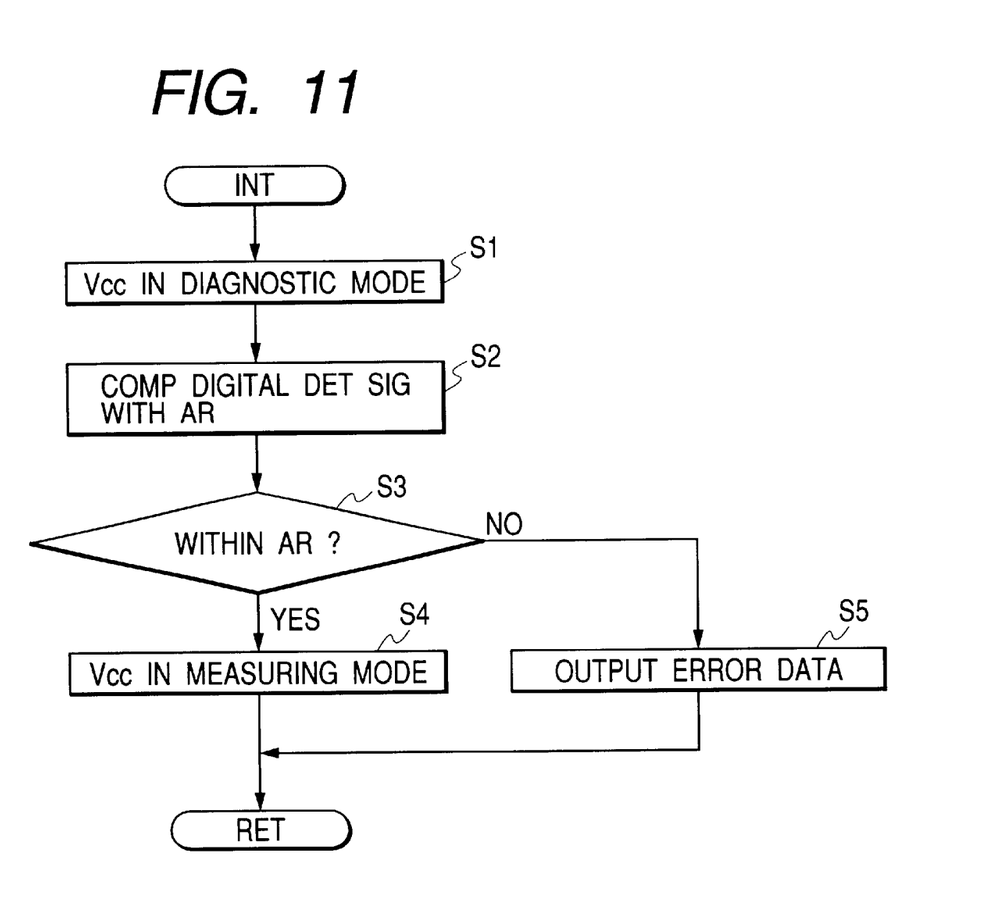
FIG. 11 depicts a flow chart according to the first embodiment illustrating an operation of the system control circuit for detecting the interconnection condition.

FIG. 11 depicts a flow chart according to the first embodiment illustrating an operation of the CPU 60 for detecting the interconnection condition.

In the main routine, the CPU 60 measures the output of the bridge in the measuring mode to supply the pressure data periodically and executes interruption operation shown in FIG. 11. This interruption executed in response to event interruption or timer interruption. More specifically, this interruption may be executed at a regular interval or in response to start of the engine of the vehicle.

The CPU 60 changes the mode to the diagnostic mode to supply the supply voltage outside the predetermined voltage range in step S1. Then, the transistors Q1 and Q2 turn on, so that the sensor 1 outputs the predetermined voltage signal. In the following step S2, the CPU 60 compares the digital predetermined voltage signal from the A/D converter 59 with the allowable voltage range (data) AR to detect the deviation in the digital predetermined voltage signal. If the digital predetermined voltage signal is outside allowable range AR in step S3, the CPU 60 outputs error data, and processing returns to the main routine. If the digital predetermined voltage signal is within the allowable range AR in step S3, the CPU 60 operates the voltage supply 56 in the measuring mode in step S4 and processing returns to the main routine.

As mentioned above, the poor contact condition is detected by comparing the present value of the digital predetermined voltage signal in the diagnostic mode with the allowable voltage range data AR. However, the poor contact condition may be detected by comparing the present value of the digital predetermined voltage signal in the diagnostic mode with the initial value of the digital predetermined voltage signal. Moreover, the poor contact condition may be detected by sudden change of the value in the digital predetermined voltage signal in the diagnostic mode. Moreover, the poor contact condition may be detected by fluctuation in the digital predetermined voltage signal in diagnostic mode.

Moreover, in step S5, if the sensor output Vout in the diagnostic mode, i.e., the predetermined voltage signal, is within a compensation allowable range which is narrower than the allowable voltage range AR, the CPU 60 may compensate the digital detection signal in the measuring mode in accordance with the deviation of the predetermined voltage signal instead outputting the error data. However, in this case, if the digital detection signal exceeds the allowable range, the CPU 60 outputs the error data.

Second Embodiment

Figure 4:
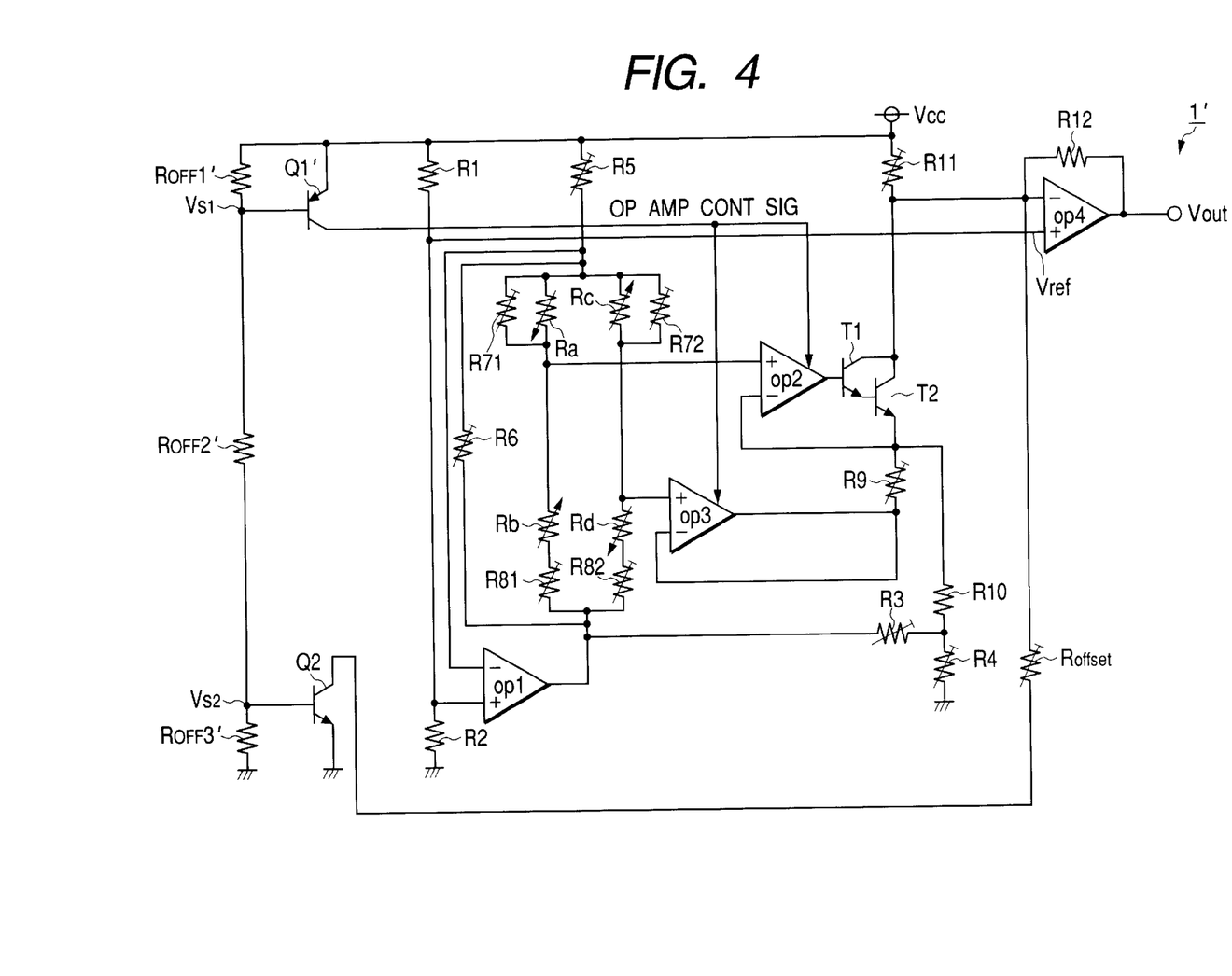
FIG. 4 is a schematic circuit diagram of a pressure sensor according to a second embodiment.

FIG. 4 is a schematic circuit diagram of a pressure sensor 1' according to the second embodiment.

The pressure sensor 1' according to the second embodiment has substantially the same structure as that of the first embodiment. The difference is that the NPN transistor Q1 is replaced with a PNP transistor Q1' and the base of the transistor Q1' is supplied with $V_{S1}$ instead Vs with dividing resistors $R_{OFF1}'$, $R_{OFF2}'$, and $R_{OFF3}'$ instead resistors $R_{OFF1}$ and $R_{OFF2}$, and that the operational amplifiers OP2' and OP3' are used instead the operational amplifiers OP2 and OP3. The transistor Q2 operates in the same manner as that in the first embodiment. That is, $V_{S2}$ corresponds to Vs in FIG. 1.

Figure 5:
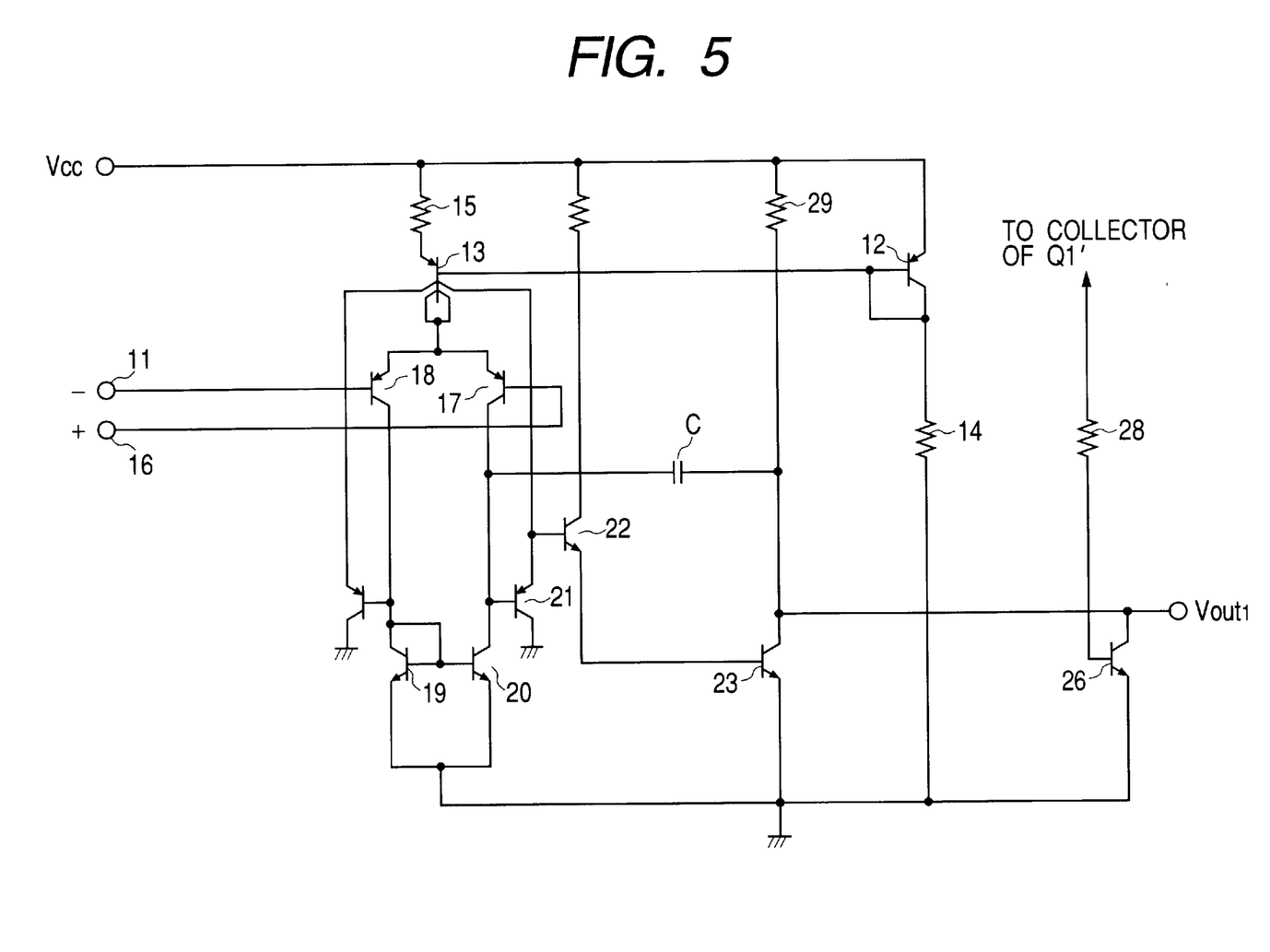
FIG. 5 is a schematic circuit diagram of the operational amplifiers according to the second embodiment.

FIG. 5 is a schematic circuit diagram of the operational amplifiers OP2' and OP3' according to the second embodiment. The collector of the transistor Q1' is connected to the base of the transistor 26 only through a resistor 28. The dividing resistors $R_{OFF1}'$, $R_{OFF2}'$, and $R_{OFF3}'$ are provided such that the transistors Q1' and Q2 are turned on at the same time when the supply voltage Vcc is outside the predetermined voltage range. Then, when the system control circuit 50 supplies the supply voltage Vcc outside the predetermined voltage range, the transistors Q1' and Q2 are turned on at the same time, and the operational amplifier OP4 generates the predetermined voltage signal at Vout. Then, the system control circuit 50 judges the interconnection condition from the detected predetermined voltage signal.

In this circuit, the number of transistors in the operational amplifiers OP2' and OP3' is reduced from that in the operational amplifiers OP2 and OP3 in the first embodiment as shown in FIGS. 3 and 5.

Modifications

In the above-mentioned embodiments, the pressure sensors 1 and 1' were described as the physical quantity detection device. However, this invention is applicable to other physical quantity detection devices using resistance variation or the like in accordance with a physical quantity such as an acceleration detection sensor.

As mentioned above, the pressure sensor 1 and 1' is supplied with a supply voltage Vcc from a system control circuit 50 having the function that the supply voltage Vcc is changed. When the supply voltage Vcc is within the predetermined voltage range, the pressure sensor 1 or 1' outputs the detection signal corresponding to the pressure to be measured and outputs a predetermined voltage which is irrespective of the pressure. More specifically, the system control circuit 50 outputs the supply voltage at a value outside the predetermined voltage range in the diagnostic mode, that is, a value which is higher than the measuring mode, in order to turn on the transistors Q1 and Q2 to supply the predetermined voltage to the system control circuit 50 to detect an error caused by increase in contact resistance between the pressure sensor and the system control circuit.

In the above-mentioned embodiments, the sensor circuit, that is, the bridge is fixedly connected to the outputting circuit including the operational amplifiers OP2 to OP4 and the transistors Q1 and Q2.

What is claimed is:

1. A physical quantity detection device supplied with a supply voltage from a system control circuit having a function for varying said supply voltage comprising:

a sensor circuit for generating a detection signal corresponding to a physical quantity to be measured; and an output circuit for outputting said detection signal when said supply voltage is within a predetermined voltage range and for generating and outputting a predetermined voltage which is irrespective of said physical quantity when said supply voltage is outside said predetermined voltage range.

2. The physical quantity detection device as claimed in claim 1, wherein said sensor circuit comprises:

a bridge circuit for generating said detection signal corresponding to said physical quantity; and wherein said outputting circuit comprising:

a voltage follower circuit coupled to said bridge circuit; and control means for controlling an output of said voltage follower circuit such that said voltage follower circuit outputs said detection signal when said supply voltage is within said predetermined voltage range, and said voltage follower circuit generates said predetermined voltage which is irrespective of said detection signal when said supply voltage is outside said predetermined voltage range.

3. The physical quantity detection device as claimed in claim 2, wherein said control means comprises a first transistor turning on and off on the basis of said supply voltage, wherein said first transistor turns off when said supply voltage is within said predetermined voltage range and turns on to make the output of said voltage follower circuit go a low voltage level when said supply voltage is outside said predetermined voltage range.

4. The physical quantity detection device as claimed in claim 2, further comprising:

an adder including an operational amplifier of which inverting input is supplied with said detection signal and of which non-inverting input is supplied with a reference voltage generated by voltage-dividing said supply voltage and a first resistor connected between said inverting input and an output of said operational amplifier; and current changing means for changing a current flowing through said first resistor when said supply voltage is outside said predetermined voltage range to make said operational amplifier output a predetermined voltage signal.

5. The physical quantity detection device as claimed in claim 4, wherein said current changing means comprises a transistor and a second resistor connected between said inverting input of said operational amplifier and said transistor, wherein said transistor turns on when said supply voltage is outside said predetermined voltage range to flow a predetermined current through said second resistor.

6. The physical quantity detection device as claimed in claim 1, further comprising first to third cables for connecting said sensor circuit to said system control circuit, said first cable supplying said supply voltage from said system control circuit to said sensor circuit, said second cable supplying said detection signal to said system control circuit, and said third cable connecting a ground of said physical quantity detection device to a ground of said system control circuit.

7. A physical quantity detection device supplied with a supply voltage from a system control circuit having a function for varying said supply voltage comprising:

a sensor circuit for generating a detection signal corresponding to a physical quantity to be measured; and an output circuit for outputting said detection signal when said supply voltage is within a first predetermined voltage range and for generating and outputting a predetermined voltage which is irrespective of said physical quantity when said supply voltage is within a second predetermined voltage range.

8. A physical quantity detection device supplied with a supply voltage comprising:

a sensor circuit for generating a detection signal in accordance with a physical quantity; and an outputting circuit connected to said sensor circuit, for outputting said detection signal when said supply voltage is within a predetermined voltage range and for generating and outputting a predetermined voltage signal that is irrespective of said physical quantity when said supply voltage is outside said predetermined voltage range.

9. The physical quantity detection device as claimed in claim 8, wherein said sensor circuit is fixedly connected to said outputting circuit.

10. The physical quantity detection device as claimed in claim 8, further comprising:

a system control circuit for generating said supply voltage within said predetermined voltage range in a first mode and outside said predetermined voltage range in a second mode;

a first cable including connectors for supplying said supply voltage from said system control circuit to said sensor circuit and said outputting circuit;

a second cable including connectors for supplying said detection signal and said predetermined voltage signal to said system control circuit; and a third cable including connectors for connecting a ground of said bridge circuit and said outputting circuit to a ground of said system control circuit.

11. The physical quantity detection device as claimed in claim 10, further comprising:

a judging circuit for judging whether said voltage signal is within an allowable voltage range and outputting a judging result in said second mode to judge conditions of said connectors of said first to third cables.

12. The physical quantity detection device as claimed in claim 10, wherein said system control circuit comprises:

a first power supply for generating said supply voltage;

a second power supply for generating another supply voltage and for generating a voltage data of said another supply voltage, said first power supply generates said supply voltage within said predetermined voltage range in accordance with said voltage data to equalize said supply voltage to said another supply voltage in said first mode, said physical quantity detection device further comprising: an A/D converter supplied with said another supply voltage for converting said detection signal into a digital detection signal, wherein voltage characteristic of said bridge circuit and a voltage characteristic of said A/D converter is compensated by equalizing said supply voltage to said another supply voltage in said first mode.

13. A physical quantity detection device comprising:

a sensor circuit for generating a detection signal in accordance with a physical quantity, and for outputting said detection signal through an output line;

a supply voltage detection circuit for detecting whether a supply voltage to be supplied to said physical quantity detection device is equal to or more than a predetermined value and for outputting an abnormal signal which is irrespective of said detection signal through said output line when said supply voltage is equal to or more than said predetermined value.

14. A physical quantity detection device comprising:

a sensor circuit for generating a detection signal in accordance with a physical quantity, and for outputting said detection signal through an output line;

a supply voltage detection circuit for detecting whether a supply voltage to be supplied to said physical quantity detection device is equal to or less than a predetermined value and for outputting an abnormal signal which is irrespective of said detection signal through said output line when said supply voltage is equal to or less than said predetermined value.

* * * * *